US007499692B2

(12) United States Patent
Nakamura et al.

(10) Patent No.: US 7,499,692 B2
(45) Date of Patent: Mar. 3, 2009

(54) RECEIVING CIRCUIT, AND RECEIVING APPARATUS AND TRANSMITTING/RECEIVING APPARATUS USING THE RECEIVING CIRCUIT

(75) Inventors: Makoto Nakamura, Kyoto (JP); Hidehiko Kurimoto, Hyogo (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 375 days.

(21) Appl. No.: 10/591,850

(22) PCT Filed: Mar. 7, 2005

(86) PCT No.: PCT/JP2005/003854

§ 371 (c)(1),
(2), (4) Date: Sep. 5, 2006

(87) PCT Pub. No.: WO2005/086362

PCT Pub. Date: Sep. 15, 2005

(65) Prior Publication Data

US 2007/0176682 A1   Aug. 2, 2007

(30) Foreign Application Priority Data

Mar. 8, 2004   (JP) .............................. 2004-063536

(51) Int. Cl.
*H04B 1/00* (2006.01)
*H04B 1/06* (2006.01)

(52) U.S. Cl. ...................... 455/296; 455/307; 455/266; 455/312; 455/245.1

(58) Field of Classification Search .............. 455/266, 455/296, 307, 311, 312, 245.1, 250.1, 339, 455/340

See application file for complete search history.eriod

(56) References Cited

U.S. PATENT DOCUMENTS 6,144,243 A * 11/2000 Vaisanen ..................... 327/307
6,442,380 B1 * 8/2002 Mohindra ................ 455/234.1
6,507,627 B1   1/2003 Imura (Continued)

FOREIGN PATENT DOCUMENTS

JP   11225179   8/1999

(Continued)

OTHER PUBLICATIONS

PCT International Search Report dated Jun. 7, 2005.

*Primary Examiner*—Duc M Nguyen
(74) *Attorney, Agent, or Firm*—Dickinson Wright, PLLC

(57) ABSTRACT

An object of the invention is to provide a receiving circuit where the quality of reception can be prevented from deteriorating when the gain changes, so that the good quality of the received signal can be preserved, as well as a receiving apparatus and a transmitting/receiving apparatus using the receiving circuit. In the configuration of the invention, a switch (113) is converted to a short state in response to a change in the gain of a variable gain amplifier (107) by means of a gain control apparatus 112, and thereby, the output terminal of a high pass filter (111) is fixed at a reference voltage and the cutoff frequency of a low pass filter (108) is increased. As a result, the period during which the DC voltage has transient response properties in the low pass filter (108) can be shortened, and this transient response prevented from passing through the high pass filter (111).

8 Claims, 4 Drawing Sheets

U.S. PATENT DOCUMENTS

| | | | |
|---|---|---|---|
| 7,110,734 B2 * | 9/2006 | Mohindra | 455/234.1 |
| 7,139,542 B2 * | 11/2006 | Vepsalainen et al. | 455/266 |
| 7,171,185 B2 * | 1/2007 | Matsumoto et al. | 455/324 |
| 2002/0197975 A1 * | 12/2002 | Chen | 455/324 |
| 2003/0142767 A1 | 7/2003 | Ichihara | |
| 2003/0156668 A1 * | 8/2003 | Atkinson et al. | 375/345 |
| 2003/0203727 A1 * | 10/2003 | Kluge et al. | 455/234.1 |
| 2003/0214423 A1 * | 11/2003 | Lee et al. | 341/118 |
| 2004/0097212 A1 | 5/2004 | Matsumoto et al. | |

FOREIGN PATENT DOCUMENTS

| | | |
|---|---|---|
| JP | 2003224488 | 8/2003 |
| JP | 2003224489 | 8/2003 |

* cited by examiner

RECEIVING CIRCUIT, AND RECEIVING APPARATUS AND TRANSMITTING/RECEIVING APPARATUS USING THE RECEIVING CIRCUIT

TECHNICAL FIELD

The present invention relates to a direct conversion system receiving circuit used for mobile communications, as well as a receiving apparatus and a transmitting/receiving apparatus using the receiving circuit.

BACKGROUND TECHNOLOGY

In recent years, demand for miniaturization and reduction in cost has increased for mobile communication devices such as cellular phones. In order to meet this demand, direct conversion system receiving apparatuses of which the number of parts can be greatly reduced have come into wide use.

There is a problem, however, with the DC offset voltage of such direct conversion system receiving apparatuses. The DC offset voltage is a primary factor in damaging the dynamic range of amplifiers, A/D converters and the like which are used for signal processing of received signals and deteriorating the bit error rate, which is a scale for indicating the quality of reception. Direct conversion system receiving apparatuses and receiving circuits having a means for suppressing this DC offset voltage have already been proposed.

In the following, a direct conversion receiving circuit according to the prior art is described.

FIG. 2 shows an example of a direct conversion system receiving circuit according to the prior art. In FIG. 2, symbol 101 indicates a receiving circuit. Symbol 102 indicates an output terminal of receiving circuit 101. Symbol 104 indicates an input terminal of a receiving circuit 101. Symbol 105 indicates a mixer. Symbol 106 indicates an input terminal for a local oscillation signal. Symbol 107 indicates a variable gain amplifier. Symbol 108 indicates a low pass filter. Symbol 109 indicates a capacitor. Symbol 110 indicates a resistor. Symbol 111 indicates a high pass filter formed of capacitor 109 and resistor 110. Symbol 112 indicates a gain control apparatus. Symbol 114 indicates a reference voltage supply in high pass filter 111.

In addition, FIG. 5 shows the gain setting in a variable gain amplifier according to the prior art and chronological change in the output DC voltage of respective portions of the receiving circuit.

In FIG. 5, waveform a represents the chronological change in the gain setting of variable gain amplifier 107. In this gain setting, the set gain changes from gain $G_1$ to gain $G_2$ in step form at time $t_1$.

Waveform b represents the chronological change in the output DC voltage of mixer 105. The output DC voltage of this mixer 105 has a value that is higher than the original operating point voltage (shown as broken line) because of DC offset voltage $V_{OFS}$ which exists in the output of mixer 105 and in the input of variable gain amplifier 107.

Waveform c represents the chronological change in the output DC voltage of variable gain amplifier 107. The output DC voltage of this variable gain amplifier 107 changes in step form in response to the change in the gain setting due to the existence of DC offset voltage $V_{OFS}$ in the output DC voltage of mixer 105. Here, the broken line indicates the output DC voltage of variable gain amplifier 107 in the case where DC offset voltage $V_{OFS}$ does not exist.

Waveform d represents the chronological change in the output DC voltage of low pass filter 108. The output DC voltage of this low pass filter 108 has a transient response waveform that responds to the change in step form in the output DC voltage of variable gain amplifier 107. Here, the broken line indicates the output DC voltage of low pass filter 108 when DC offset voltage $V_{OFS}$ does not exist.

Waveform e represents the chronological change in the output DC voltage of high pass filter 111. The transient response in the output DC voltage of low pass filter 108 remains in the output DC voltage of this high pass filter 111.

The operation of the direct conversion system receiving circuit formed as described above is described in the following.

In the direct conversion system receiving circuit, frequency conversion is carried out using a local oscillation signal that is inputted into input terminal for local oscillation signals 106, so that a high frequency signal that is inputted from signal input terminal 104 into mixer 105 is converted to a base band signal and then outputted. In the direct conversion system, however, the carrier frequency of this high frequency signal and the oscillation frequency of the local oscillation signal have the same frequency. Therefore, in the case where the local oscillation signal leaks to signal input terminal 104, for example, this leaked signal has the same frequency as the local oscillation signal, and therefore, is outputted as a DC offset voltage as a result of frequency conversion in mixer 105. In addition, a DC offset voltage is generated due to relative inconsistency in the circuit elements which form variable gain amplifier 107, low pass filter 108 and the like.

It is possible to remove a DC offset voltage that has been generated in this manner using high pass filter 111 which is formed of capacitor 109 and resistor 110. In addition, it is possible to sufficiently pass the base band signal by appropriately setting the cut off frequency of this high pass filter 111. Thus, it is possible to gain a demodulated signal without deteriorating the quality of the received signal (see for example Patent Document 1).

Patent Document 1: Japanese Unexamined Patent Publication H11 (1999)-225179

DISCLOSURE OF THE INVENTION

Problem to Be Solved by the Invention

In the configuration of the prior art shown in FIG. 2, however, when the gain of variable gain amplifier 107 is changed from G1 to G2 using gain control apparatus 112 as shown in waveform a of FIG. 5, DC offset voltage $V_{OFS}$ (waveform b of FIG. 5) changes in response to this change in the gain, as shown in waveform c of FIG. 5, in the output DC voltage of variable gain amplifier 107.

This change in the voltage generates a transient response (waveform d of FIG. 5) by means of low pass filter 108. This voltage is inputted into high pass filter 111, and therefore, there is transient fluctuation in the DC voltage, as shown in waveform e of FIG. 5, in the output of high pass filter 111. As a result, a problem arises, such that the quality of reception deteriorates.

An object of the present invention is to provide a receiving circuit which, when implemented, makes it easy to avoid deterioration in the quality of reception when the gain setting is changed, as well as a receiving apparatus and a transmitting/receiving apparatus using the receiving circuit.

Means for Solving Problem

The present invention is primarily characterized in that the output of a high pass filter that is cascaded with a variable gain amplifying apparatus is fixed at a reference voltage for a constant period of time when the gain of the variable gain amplifying apparatus is changed, and the cutoff frequency of a low pass filter that is cascaded with the variable gain amplifying apparatus and the high pass filter is set higher than the original cutoff frequency for a constant period of time.

In order to achieve this object, the receiving circuit of the present invention and a receiving apparatus and a transmitting/receiving apparatus using the receiving circuit are provided with the configuration according to the prior art, and in addition, the low pass filter has a function of changing the cutoff frequency by means of a control signal, and a switch is connected to the output of the high pass filter. Thus, the above described switch is controlled so that the output of the above described high pass filter is fixed at a reference voltage for a constant period of time in response to the control for changing the gain of the variable gain amplifying apparatus, and the configuration allows the above described low pass filter to be controlled so that the cutoff frequency thereof increases for a constant period of time.

This configuration makes it possible to suppress the transient response of the DC voltage which is generated when the gain is changed and shorten the period of time for transient response, and accordingly, the period of time during which the received signal is missing can be shortened, making it possible to prevent the quality of reception from deteriorating.

In the following, the invention is concretely described.

A receiving circuit of the present invention is provided with: a variable gain amplifying apparatus for amplifying a received modulated signal; a high pass filter for removing low frequency components of the modulated signal which is cascaded to the variable gain amplifying apparatus; a switch for fixing the output voltage of the high pass filter to a reference voltage; a low pass filter for removing high frequency components of the modulated signal which is cascaded to a cascaded circuit of the variable gain amplifying apparatus and the high pass filter and makes it possible to change the cutoff frequency; and a gain control apparatus for changing the gain of the variable gain amplifying apparatus in order to change the size of the modulated signal that passes through the variable gain amplifying apparatus, the high pass filter and the low pass filter.

In addition, in response to control for changing the gain of the variable gain amplifying apparatus, the gain control apparatus controls the switch, and thereby, fixes the output of the high pass filter at the reference voltage for a constant period of time, and in addition, controls the low pass filter, and thereby, makes the cutoff frequency of the low pass filter higher than the original cutoff frequency for a constant period of time.

It is preferable for the gain control apparatus in the above described receiving circuit of the present invention to be formed as follows. That is to say, the gain control apparatus controls the switch, and thereby, fixes the output of the high pass filter at the reference voltage, and, at the same time or after a constant period of time has passed, controls the low pass filter, and thereby, increases the cutoff frequency of the low pass filter, carries out control for changing the gain of the variable gain amplifying apparatus after a constant period of time has passed after the cutoff frequency of said low pass filter has increased, and controls the low pass filter after a constant period of time has passed after the control for changing the gain so as to return the cutoff frequency of the low pass filter to the original state, and releases the output of the high pass filter from the fixed state at the reference voltage after a constant period of time has passed after the cutoff frequency of the low pass filter has returned to the original state.

In addition, in the above described receiving circuit of the present invention, one or more variable gain amplifying apparatus, high pass filter and low pass filter which are the same as the above described variable gain amplifying apparatus, high pass filter and low pass filter, are cascaded in an arbitrary order and combination.

In addition, in the above described receiving circuit of the present invention, it is preferable for a mixer for carrying out frequency conversion using a local oscillation signal so that a received and gained high frequency signal including a modulated component is converted to the modulated signal to be provided in an input portion of the variable gain amplifying apparatus.

A receiving apparatus of the present invention is provided with: the above described receiving circuit having a mixer; a source for a local oscillation signal which supplies the local oscillation signal to the mixer; and a demodulating means for carrying out appropriate signal processing on a modulated signal gained from the receiving circuit so as to gain a predetermined demodulated signal.

In addition, a transmitting/receiving apparatus of the present invention is provided with: a receiving apparatus as described above; a transmitting apparatus for modulating a predetermined signal and carrying out frequency conversion so as to gain a high frequency signal which is then fed out; and a signal selecting apparatus where one selection terminal portion is connected to an input of the receiving apparatus and the other selection terminal portion is connected to an output of the transmitting apparatus.

In the above described transmitting/receiving apparatus, an antenna switch or a duplexer is used as the signal selecting apparatus.

Effects of the Invention

As described above, according to the present invention, a switch is provided for the output of a high pass filter, and the output of the high pass filter is fixed at a reference voltage using the switch in response to the change in the gain of a variable gain amplifier, and the cutoff frequency of a low pass filter is made higher than the original cutoff frequency. As a result, the transient response of the DC voltage which is generated in the output of the high pass filter when the gain is changed can be prevented, and in addition, the period during which there is a transient response can be shortened, and accordingly, the period during the received signal is missing can be shortened. Consequently, an excellent receiving circuit having good quality of reception, as well as a receiving apparatus and a transmitting/receiving apparatus having the same can be implemented.

Figure 1:
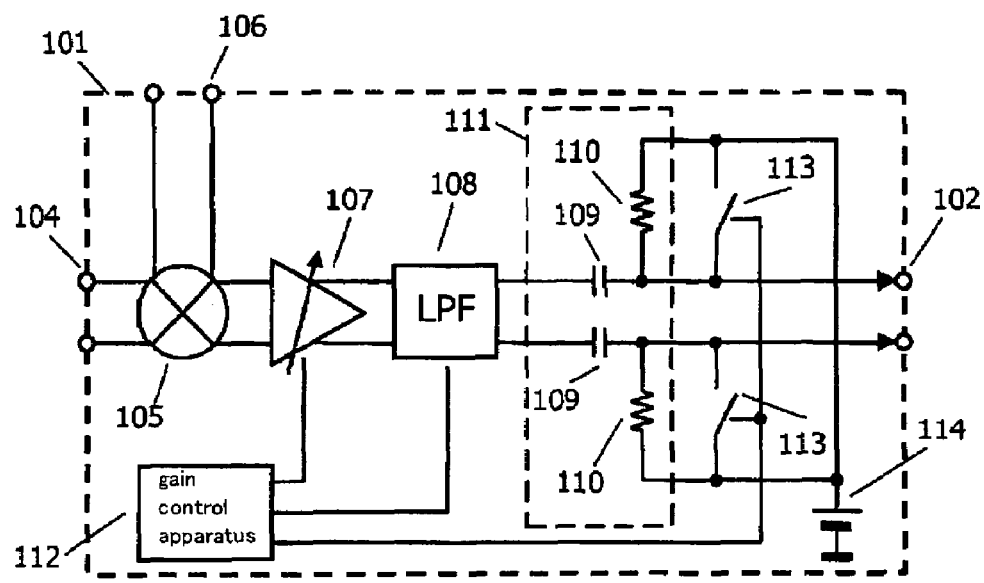
FIG. 1 is a circuit diagram showing the configuration of a portion of a receiving circuit according to Embodiment 1 of the present invention.
Figure 2:
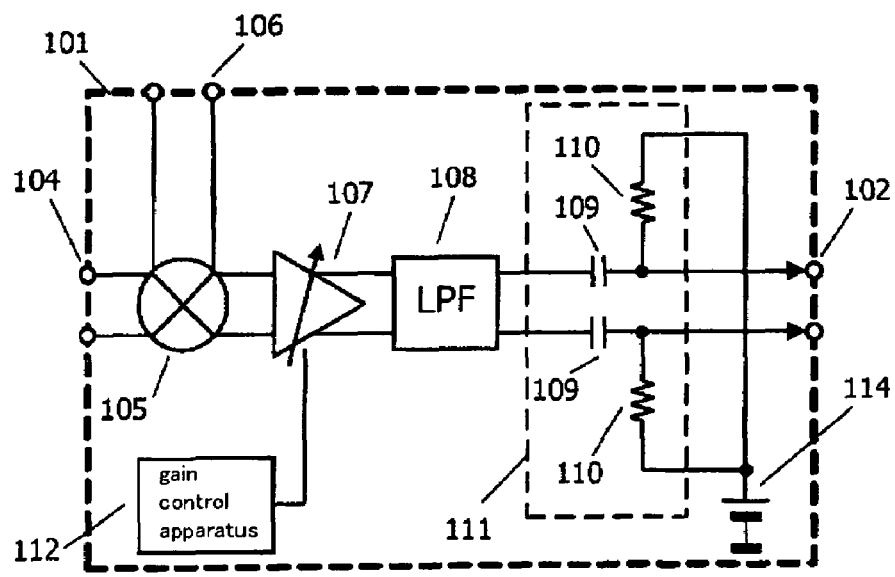
FIG. 2 is a circuit diagram showing the configuration of a portion of a receiving circuit according to the prior art.

EXPLANATION OF SYMBOLS 101 receiving circuit
102 output terminal of receiving circuit 101
104 input terminal of receiving circuit 101
105 mixer
106 input terminal for local oscillation signal
107 variable gain amplifier
108 low pass filter
109 capacitor
110 resistor
111 high pass filter
112 gain control apparatus
113 switch
114 reference voltage supply
201 source for local oscillation signal
202 demodulated signal processing circuit
203 receiving apparatus
204 input terminal of receiving apparatus 203
205 transmitting apparatus
206 output terminal of transmitting apparatus 205
207 duplexer
208 transmitting/receiving apparatus
209 terminal of transmitting/receiving apparatus 208
a waveform showing change in gain determined by gain control apparatus 112
b waveform showing DC offset voltage generated in output of mixer 105 or in input of variable gain amplifier 107
c waveform showing change in DC voltage in output of variable gain amplifier 107
d waveform showing fluctuation in DC voltage in output of low pass filter 108
e waveform showing fluctuation in DC voltage in output of high pass filter 111 according to prior art
f waveform showing example of state of switch according to Embodiment 1
g waveform showing DC voltage in output of high pass filter 111 according to Embodiment 1
h waveform showing effects when cutoff frequency of low pass filter 108 is increased according to Embodiment 1
h' waveform showing effects when cutoff frequency of low pass filter 108 is further increased according to Embodiment 1
k waveform showing state of cutoff frequency of low pass filter 108 according to Embodiment 1
$t_i$ time when gain of variable gain amplifier 107 is changed according to Embodiment 1
$t_2$ time when state of switch 113 is returned to original open state according to Embodiment 1
$t_3$ time when cutoff frequency of low pass filter 108 is returned to original state according to Embodiment 1
$t_4$ time when state of switch 113 is changed to a short state according to the embodiment
$t_5$ time when cutoff frequency of low pass filter 108 is increased according to the embodiment

BEST MOST FOR CARRYING OUT THE INVENTION

In the following, the embodiments of the present invention are described in reference to the drawings.

Embodiment 1

In the following, a receiving circuit according to an embodiment of the present invention is described in reference to the drawings. FIG. 1 shows an example of the configuration of a receiving circuit according to this embodiment of the present invention. In FIG. 1, symbol 101 indicates a receiving circuit. Symbol 102 indicates an output terminal of receiving circuit 101. Symbol 104 indicates an input terminal of receiving circuit 101. Symbol 105 indicates a mixer. Symbol 106 indicates an input terminal for a local oscillation signal. Symbol 107 indicates a variable gain amplifier which changes the gain in response to a control signal.

Symbol 108 indicates a low pass filter which can change the cutoff frequency by switching the time constant in response to a control signal. The resistance value of the resistor and the capacitor which form the low pass filter can be switched using a switch or the like, and thereby, the time constant can be switched.

Symbol 109 indicates a capacitor. Symbol 110 indicates a resistor. Symbol 111 indicates a high pass filter formed of capacitor 109 and resistor 110.

Symbol 113 indicates a switch for fixing the output voltage of high pass filter 111 at a reference voltage in response to the control signal that is supplied from gain control apparatus 112. Symbol 112 indicates a gain control apparatus for supplying a control signal to variable gain amplifier 107, low pass filter 108 and switch 113. Symbol 114 indicates a source for a reference voltage of high pass filter 111.

Figure 6:
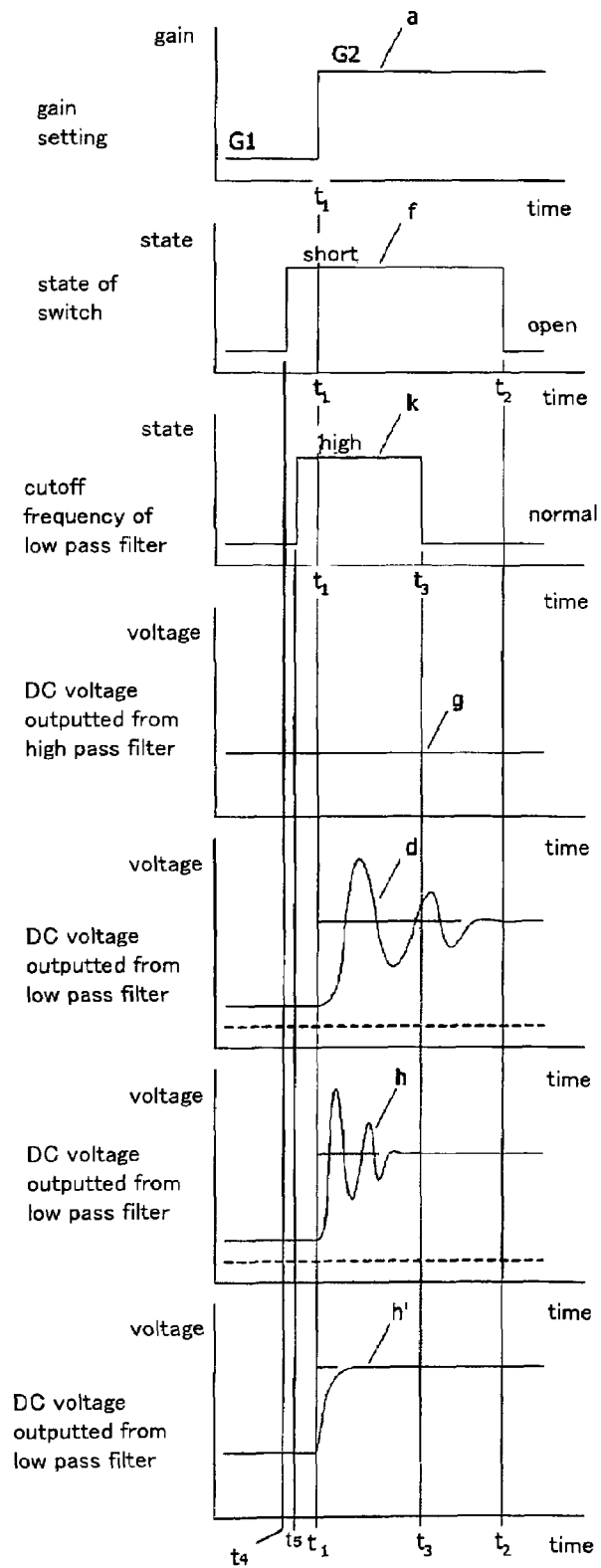
FIG. 6 is a schematic diagram showing the change in the DC output voltage in respective portions of a receiving circuit when the gain is changed according to Embodiment 1 of the present invention.

In addition, FIG. 6 is a diagram illustrating the chronological change in the gain of variable gain amplifier 107, the state of the cutoff frequency of switch 113 and low pass filter 108, and the DC voltage of respective portions of the receiving circuit according to the present embodiment.

In FIG. 6, waveform a shows the chronological change in the gain setting for variable gain amplifier 107. In this gain setting, the gain changes from gain $G_1$ to gain $G_2$ in step form at time $t_1$.

Waveform d shows the chronological change in the DC voltage outputted from low pass filter 108. The DC voltage outputted from this low pass filter 108 has a transient response waveform corresponding to the change in step form in the DC voltage outputted from variable gain amplifier 107. Here, the broken line indicates the DC voltage outputted from low pass filter 108 in the case where DC offset voltage $V_{OFS}$ does not exist.

Waveform f shows the state of switch 113. This switch 113 changes from the open state to the short state at time $t_4$ and returns from the short state to the open state at time $t_2$.

Waveform g shows the chronological change in the DC voltage outputted from high pass filter 111. The DC voltage outputted from this high pass filter 11 is maintained at a constant voltage.

Waveforms h and h' show the chronological change in the DC voltage outputted from low pass filter 108 which has been improved by temporarily increasing the cutoff frequency of low pass filter 108 prior to the change in the gain of the variable gain amplifier. Here, the cutoff frequency of low pass filter 108 when waveform h' is gained is higher than the cutoff frequency of low pass filter 108 when waveform h is gained.

Waveform k shows the chronological change in each state of the cutoff frequency of low pass filter 108. The cutoff frequency of this low pass filter 108 is increased at time $t_5$ and returned to the original state at time $t_3$. Here, time $t_5$ and time $t_3$ may be the same as time $t_4$ and time $t_2$, respectively.

The operation of the receiving circuit that is formed as described above is described in the following.

In the configuration of FIG. 1, the DC offset voltage is generated in the same manner as in the prior art, and likewise, there is a transient response waveform (waveform d of FIG. 6) in the output of low pass filter 108 when the gain of variable gain amplifier 107 is changed.

Here, as shown in waveform f of FIG. 6, during the period where there is a transient response in low pass filter 108 starting from time $t_4$ before time $t_1$ when the gain of variable gain amplifier 107 is changed by gain control apparatus 112, switch 113 is converted to the short state so that the output of high pass filter 111 is fixed at the voltage of the source for a reference voltage 114, and thereby, a transient response can be prevented in the DC voltage in the output of high pass filter 111, as shown in waveform g of FIG. 6.

However, conversion of switch 113 to the short state, where the voltage is fixed at the voltage of source for a reference voltage 114, means cutting off the received signal, and therefore, it is desirable to shorten the period of this short state, in order to maintain a good quality of reception.

The period during which there is transient response in low pass filter 108 depends on the cutoff frequency, and when the cutoff frequency is increased, the period during which there is transient response becomes shorter than the original period, as shown in waveforms h and h' of FIG. 6. Therefore, switch 113 is converted to the short state before time $t_1$, and the cutoff frequency of low pass filter 108 is increased sufficiently. Then, the cutoff frequency is returned to the original state at time $t_3$, after low pass filter 108 has settled to a constant state, and switch 113 is returned to the original open state at time $t_2$ after this. By doing so, it becomes possible to prevent transient response in the DC voltage in the output of high pass filter 111 even when the period during which the received signal is cut off is shortened, and it becomes possible to maintain a good quality of reception.

As described above, in the receiving circuit according to the present embodiment, the output of high pass filter 111 is fixed at the voltage of source for a reference voltage 114 by means of switch 113 in response to the change in the gain of variable gain amplifier 107 by means of gain control apparatus 112, and the cutoff frequency of low pass filter 108 is increased. As a result, a transient response signal can be prevented in the DC voltage in the output of high pass filter 111 when the gain is changed. Consequently, it becomes possible to maintain the good quality of the received signal.

In addition, though in the above described embodiment, a state where one variable gain amplifier 107, one low pass filter 108 and one high pass filter 111 are connected is shown, it is also possible to change the order of connection of variable gain amplifier 107 and low pass filter 108 according to the present invention. That is to say, though in the above described embodiment, a variable gain amplifier, a low pass filter and a high pass filter are connected in this order, connection may be made in the order of variable gain amplifier, high pass filter, low pass filter, or the connection may be in the order of low pass filter, variable gain amplifier, high pass filter. In addition, the same effects can be gained also in the case where a number of combinations as these are cascaded.

Embodiment 2

Figure 3:
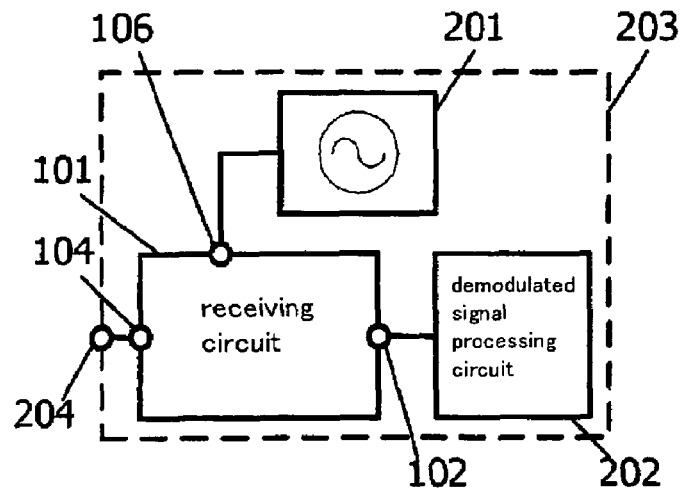
FIG. 3 is a circuit diagram showing the configuration of a receiving apparatus according to Embodiment 2 of the present invention.

Next, Embodiment 2 of the present invention is described in reference to the drawings. FIG. 3 is a circuit diagram showing an example of the configuration of a receiving apparatus according to this embodiment of the present invention. In FIG. 3, symbol 101 indicates the same receiving circuit as that according to the above described Embodiment 1. Symbol 102 indicates an output terminal of receiving circuit 101. Symbol 104 indicates an input terminal of receiving circuit 104. Symbol 106 indicates an input terminal for a local oscillation signal. Symbol 201 indicates a source for a local oscillation signal. Symbol 202 indicates a demodulated signal processing circuit. Symbol 203 indicates a receiving apparatus formed of these components. Symbol 204 indicates an input terminal of receiving apparatus 203.

The operation of the receiving apparatus that is formed as described above is described in the following.

Frequency conversion is carried out using a local oscillation signal that is generated by source for a local oscillation signal 201, so that a high frequency signal that has been inputted into input terminal 204 is converted to a modulated signal in a base band within receiving circuit 101.

The method for preventing transient response in the DC voltage when the gain is changed in receiving circuit 101 is the same as that described in the above described Embodiment 1.

Appropriate signal processing is carried out by demodulated signal processing circuit 202 on the modulated signal which has been adjusted to an appropriate level within receiving circuit 101 and outputted to output terminal 102, and thus, it becomes possible to gain a predetermined demodulated signal.

Embodiment 3

Figure 4:
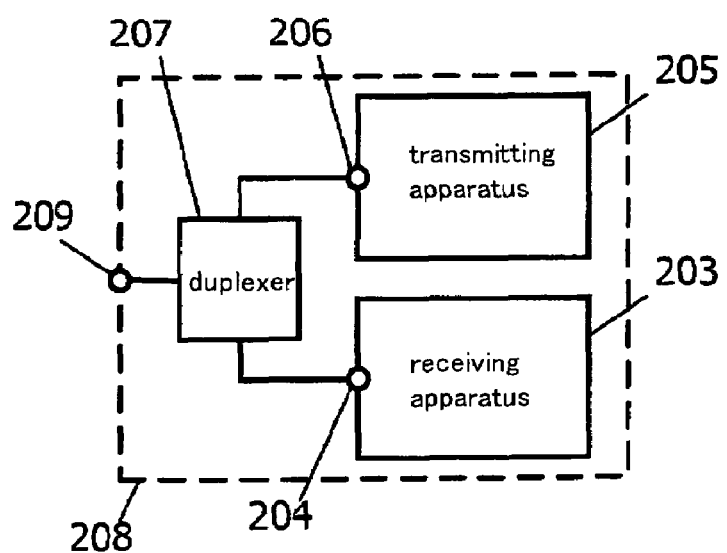
FIG. 4 is a circuit diagram showing the configuration of a transmitting/receiving apparatus according to Embodiment 3 of the present invention.
Figure 5:
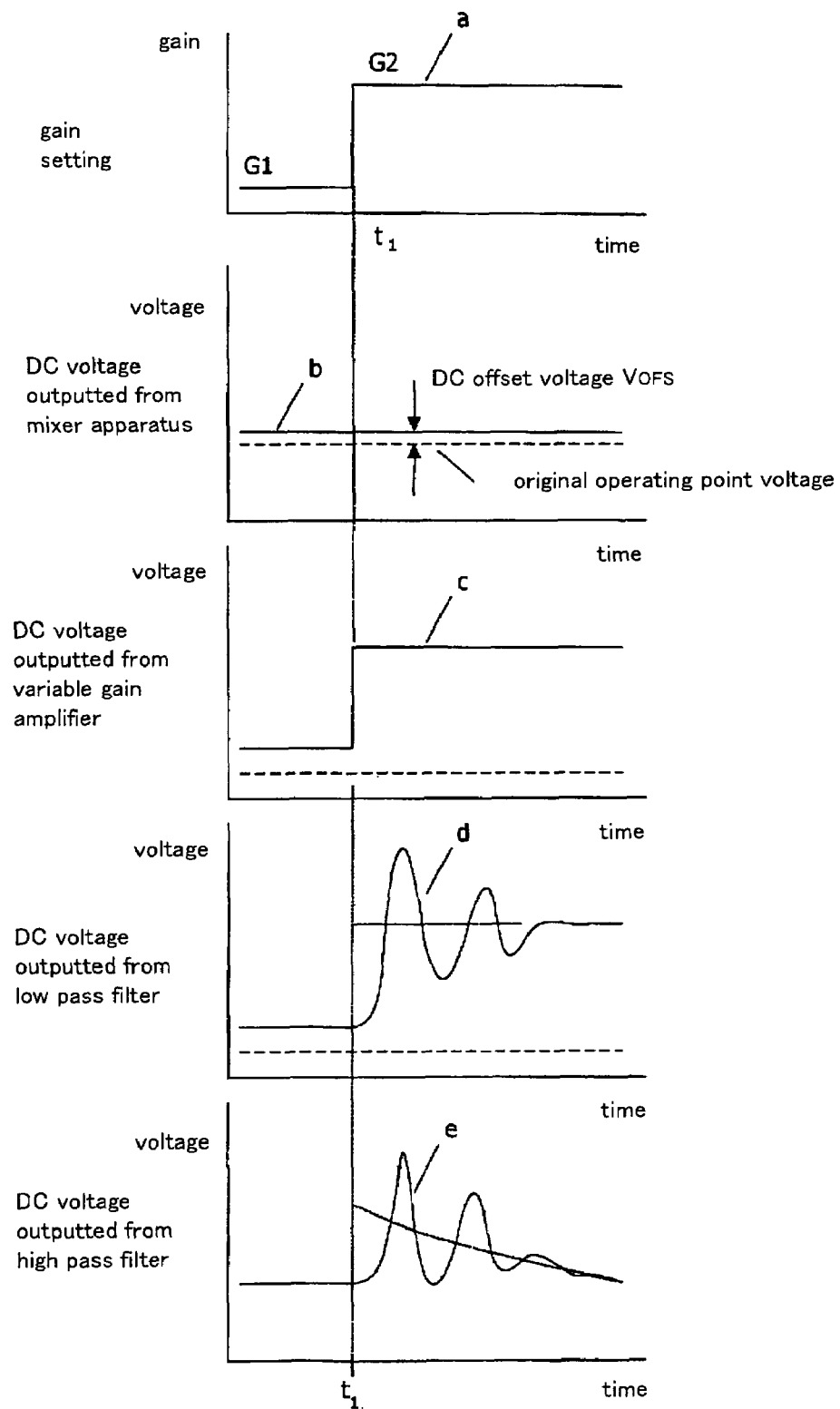
FIG. 5 is a schematic diagram showing the change in the outputted DC voltage in respective portions of a receiving circuit when the gain is changed according to the prior art.

Next, Embodiment 3 of the present invention is described in reference to the drawings. FIG. 4 is a circuit diagram showing an example of the configuration of a transmitting/receiving apparatus according to this embodiment of the present invention. In FIG. 4, symbol 203 indicates the same receiving apparatus as that according to the above described Embodiment 2. Symbol 204 indicates an input terminal of receiving apparatus 203. Symbol 205 indicates a transmitting apparatus. Symbol 206 indicates an output terminal of transmitting apparatus 205. Symbol 207 indicates a duplexer. Symbol 208 indicates a transmitting/receiving apparatus formed of these components. Symbol 209 indicates a terminal of the transmitting/receiving apparatus.

The operation of the transmitting/receiving apparatus that is formed as described above is described in the following.

A high frequency signal that has been inputted from terminal 209 is selectively outputted only to input terminal 204 by means of duplexer 207. The method for gaining a predetermined demodulated signal from the high frequency signal that has been inputted into receiving apparatus 203 through input terminal 204 and the method for preventing transient response in the DC output are the same as those described in Embodiment 2.

The high frequency signal on which appropriate signal processing is carried out in transmitting apparatus 205 is inputted into duplexer 20 through output terminal 206 and selectively outputted to terminal 209. Here, the common terminal of duplexer 207 is connected to, for example, an antenna.

It becomes possible to implement a transmitting/receiving apparatus having high precision by providing the configuration described above.

Here, though a case where duplexer 207 is used is described in the above, it may be possible to replace this with an antenna switch, depending on the system used.

INDUSTRIAL APPLICABILITY

As described above, according to the present invention, a switch is provided for the output of a high pass filter, and this switch is fixed at a reference voltage in response to the change in the gain of a variable gain amplifier, and the cutoff frequency of a low pass filter is changed, and thereby, transient response can be prevented in the DC voltage in the output of the high pass filter when the gain is changed. Accordingly, an excellent receiving circuit having good quality of reception, as well as a receiving apparatus having the same and a transmitting/receiving apparatus having such a receiving apparatus as a component, can be implemented.

The invention claimed is:

1. A receiving circuit, comprising:
   a variable gain amplifying apparatus for amplifying a received modulated signal;
   a high pass filter for removing low frequency components of said modulated signal which is cascaded to said variable gain amplifying apparatus;
   a switch for fixing the output voltage of said high pass filter to a reference voltage;
   a low pass filter for removing high frequency components of said modulated signal which is cascaded to a cascaded circuit of said variable gain amplifying apparatus and said high pass filter and makes it possible to change the cutoff frequency; and
   a gain control apparatus for changing the gain of said variable gain amplifying apparatus in order to change the size of the modulated signal that passes through said variable gain amplifying apparatus, said high pass filter and said low pass filter, wherein
   in response to control for changing the gain of said variable gain amplifying apparatus, said gain control apparatus controls said switch, and thereby, fixes the output of said high pass filter at said reference voltage for a constant period of time, and in addition, controls said low pass filter, and thereby, makes the cutoff frequency of said low pass filter higher than the original cutoff frequency for a constant period of time.

2. The receiving circuit according to claim 1, wherein said gain control apparatus controls said switch, and thereby, fixes the output of said high pass filter at said reference voltage, and, at the same time or after a constant period of time has passed, controls said low pass filter, and thereby, increases the cutoff frequency of said low pass filter, carries out control for changing the gain of said variable gain amplifying apparatus after a constant period of time has passed after the cutoff frequency of said low pass filter has increased, and controls said low pass filter after a constant period of time has passed after the control for changing said gain so as to return the cutoff frequency of said low pass filter to the original state, and releases the output of said high pass filter from the fixed state at said reference voltage after a constant period of time has passed after the cutoff frequency of said low pass filter has returned to the original state.

3. The receiving circuit according to claim 1, wherein one or more variable gain amplifying apparatus, high pass filter and low pass filter which are the same as said variable gain amplifying apparatus, said high pass filter and said low pass filter, are cascaded in an arbitrary order and combination.

4. The receiving circuit according to claim 1, wherein a mixer for carrying out frequency conversion using a local oscillation signal so that a received and gained high frequency signal including a modulated component is converted to said modulated signal is provided in an input portion of said variable gain amplifying apparatus.

5. A receiving apparatus, comprising:
   the receiving circuit according to claim 4;
   a source for a local oscillation signal which supplies said local oscillation signal to said mixer; and
   a demodulating means for carrying out appropriate signal processing on a modulated signal gained from said receiving circuit so as to gain a predetermined demodulated signal.

6. A transmitting/receiving apparatus, comprising:
   the receiving apparatus according to claim 5;
   a transmitting apparatus for modulating a predetermined signal and carrying out frequency conversion so as to gain a high frequency signal which is then fed out; and
   a signal selecting apparatus where one selection terminal portion is connected to an input of said receiving apparatus and the other selection terminal portion is connected to an output of said transmitting apparatus.

7. The transmitting/receiving apparatus according to claim 6, wherein said signal selecting apparatus is an antenna switch.

8. The transmitting/receiving apparatus according to claim 6, wherein said signal selecting apparatus is a duplexer.

* * * * *